United States Patent [19]

Matsuno

[11] Patent Number: 4,851,761
[45] Date of Patent: Jul. 25, 1989

[54] METHOD FOR MEASURING INSULATION RESISTANCE OF ELECTRIC LINE

[75] Inventor: Tatsuji Matsuno, Kanagawa, Japan

[73] Assignee: Toyo Communication Equipment Co., Ltd., Kanagawa, Japan

[21] Appl. No.: 266,694

[22] Filed: Nov. 3, 1988

[51] Int. Cl.⁴ .................. G01R 27/00; G01R 31/02
[52] U.S. Cl. .................................. 324/62; 324/509; 324/544; 324/551
[58] Field of Search ............. 324/509, 521, 522, 527, 324/539, 541, 544, 62, 57 R, 525, 551

[56] References Cited

U.S. PATENT DOCUMENTS

| | | | |
|---|---|---|---|
| 4,200,835 | 4/1980 | Anahara et al. | 324/541 X |
| 4,422,034 | 12/1983 | Matsuno et al. | 324/541 |
| 4,472,676 | 9/1984 | Eichmann et al. | 324/509 |
| 4,638,242 | 1/1987 | Matsuno | 324/551 |
| 4,791,375 | 12/1988 | Kan | 324/522 X |

FOREIGN PATENT DOCUMENTS

| | | | |
|---|---|---|---|
| 0010666 | 1/1983 | Japan | 324/521 |
| 0186765 | 9/1985 | Japan | 324/551 |
| 0043572 | 2/1987 | Japan | 324/551 |

*Primary Examiner*—Gerard R. Strecker
*Assistant Examiner*—Jack B. Harvey
*Attorney, Agent, or Firm*—Spensley Horn Jubas & Luitz

[57] ABSTRACT

A method for measuring an insulation resistance of an electric line. A low frequency signal, which has the same frequency as a signal applied to the electric line and is in phase with the line applied signal or shifted by 90 degrees therefrom, is applied with the amplitude value being varied with a period T. A leakage current sent to synchronous detector is adjusted with respect to its phase or a reference signal is adjusted with respect to its phase to minimize (make zero) or maximize one of induced effective components or induced ineffective or reactive components of the leakage current having a frequency of 1/T.

6 Claims, 5 Drawing Sheets

METHOD FOR MEASURING INSULATION RESISTANCE OF ELECTRIC LINE

BACKGROUND OF THE INVENTION

1. Field of the Invention

The present invention relates to a method of compensating for a measurement error in an apparatus which measures the insulation resistance of an electric power transmission line, a grounding line for lightning protection or the like.

2. Description of the Related Art

There has been so far known in electric power transmission facilities such a measurement apparatus which monitors the insulation resistance between an electric line and the ground and detects the insulation deterioration of the line as fast as possible, thus preventing beforehand any trouble from occurring for the stable transmission of electric power. An example of such a measurement apparatus is given by an electric circuit in FIG. 1, which measures an insulation resistance $R_0$ between an electric line and the ground in the event where the electric power of a voltage stepped down by a transformer T is supplied or transmitted through electric lines 1 and 2 on of which is connected to the earth E through a grounding conductor $L_E$.

Figure 1:
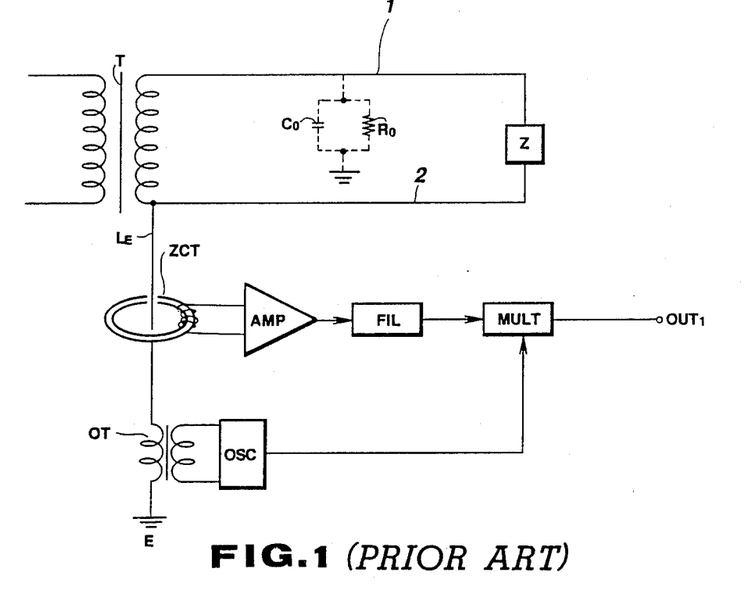
FIG. 1 is a block diagram of a prior art insulation resistance measuring apparatus.

More specifically, the aforementioned circuit of FIG. 1 is arranged so that a transformer OT, which is connected to a low frequency signal oscillator OSC generating a measuring signal of a low frequency different from a commercial power source frequency, is inserted in the grounding line $L_E$ of the power receiving transformer T to apply a measuring low frequency voltage to the electric lines 1 and 2; a current transformer ZCT having the grounding line $L_E$ passed therethrough detects a leakage current of the aforementioned measuring low frequency signal that is fed back to the grounding conductor through the insulation resistance $R_0$ and an earth stray capacity $C_0$ existing between the electric lines and the earth; an amplifier AMP connected to the current transformer ZCT amplifies the detected leakage current; a filter FIL connected to the amplifier AMP extracts only a frequency $f_1$ component from the amplified signal; and a multiplier MULT synchronously detects the extracted component with use of, for example, an output signal of the oscillator OSC to detect an effective component (OUT$_1$) (that is, a component in phase with the applied low-frequency voltage) of the leakage current and to thereby measure the insulation resistance of the electric lines.

Explanation will next be made as to the measuring theory.

Assuming now that the measuring signal voltage applied to the grounding line $L_E$ is of a sine wave $V \sin \omega_1 t$ ($\omega_1 = 2\pi f_1$), then a leakage current I of a frequency $f_1$ fed back to the grounding line $L_E$ through an earth point E is expressed by the following equation.

$$I = (V/R_0) \cdot \sin \omega_1 t + \omega_1 C_0 V \cos \omega_1 t \quad (1)$$

The leakage current I extracted by the current transformer ZCT and passed through the amplifier AMP and the filter FIL is synchronously detected by the multiplier MULT with the signal of the oscillator OSC in phase with the low-frequency signal applied to the electric lines to extract its effective component, i.e., the first term in the right side of the above equation (1). The effective component, which is inversely proportional to the insulation resistance $R_0$, can be used to find the insulation resistance of the electric lines. With such a prior art method of detecting at the zero-phase current transformer ZCT the leakage current fed back to the grounding line and extracting and outputting at the filter FIL the component having a frequency of $f_1$ from the leakage current, however, when the leakage current component of the frequency $f_1$ is shifted in phase through passage of a system comprising the zero-phase current transformer ZCT, the amplifier AMP and the filter FIL, it becomes impossible to calculate the value of the insulation resistance accurately. To avoid this, it has been conventional to use a phase shifter which adjusts with respect to phase one or both of the signal sent to the multiplier MULT, i.e., the signal sent from the low frequency oscillator OSC and the leakage current passed through the extracting filter FIL from the current transformer ZCT to thereby set or correct a phase difference between the both signals to be zero.

However, the prior art method has been defective in that the phase characteristics of the current transformer ZCT, filter FIL, phase shifter and so on vary with temperature variations, the deterioration of characteristics of used parts with age and so on, which results in that a phase error from the initial adjustment value takes place, thus making it impossible to provide a correct measurement result. To cope with the defect, there has been so far employed such a high quality of zero-phase current transformer, filter and the like that are very small in their characteristic variations to thereby minimize the influence due to the phase error. Even so, it has been impossible to completely eliminate the influence.

More in detail, if the leakage current component I of the frequency $f_1$ shown in the equation (1) is assumed to have a phase shift $\theta$ when passed through the system of the zero-phase current transformer ZCT, amplifier AMP and filter FIL, then the filter FIL produces such an output $I_1$ as follows.

$$I_1 = (V/R_0) \sin (\omega_1 t + \theta) + \omega_1 C_0 V \cos (\omega_1 t + \theta) \quad (2)$$

And the output $I_1$ is applied to a first input terminal of the multiplier MULT.

Assuming a voltage applied to a second input terminal of the synchronous detector is, for example, $a_0 \sin (\omega_1 t + \theta_1)$ of a constant amplitude, then an output or an effective component D of the synchronous detector is expressed as follows.

$$\begin{aligned} D &= I_1 \times a_0 \sin(\omega_1 t + \theta_1) \\ &= (Va_0/2R_o)\cos(\theta - \theta_1) - (\omega_1 C_o V a_0/2)\sin(\theta - \theta_1) \end{aligned}$$

where — means to eliminate components of D above angular frequency $\omega_1$.

Hence, an output $D_0$ when $\theta = \theta_1$ is given as follows.

$$D_0 = Va_0/2R_0 \quad (5)$$

Since V and $a_0$ are constant, the output $D_0$ can be measured as a value inversely proportional to the insulation resistance $R_0$. Accordingly, an error E for the effective component D with respect to the output $D_0$ when the phase shift $(\theta - \theta_1)$ is not zero becomes:

$$E = (D_o - D)/D_o \qquad (6)$$
$$= 1 - \cos(\theta - \theta_1) - \omega_1 C_o R_o \sin(\theta - \theta_1)$$

For example, when $\theta - \theta_1 = 1$ degree, $R_0 = 20$ K$\Omega$ and $C_0 = 5$ $\mu$F, $f_1 = 25$ Hz and $\omega_1 C_0 R_0 \approx 15.7$. This yields 27.4% of an error $\epsilon$ with a remarkably large measurement error.

It is an object of the present invention to provide a phase correcting method in an insulation resistance measuring apparatus, which eliminates the above defects in the prior art insulation resistance measuring method, and which can automatically correct a phase shift in a measurement signal inexpensively without the need for any expensive parts and can produce always a correct measurement result.

SUMMARY OF THE INVENTION

In accordance with the present invention, the above object is attained by providing the following arrangement. That is, the present invention is arranged so that a low frequency signal, which has the same frequency as a signal applied to electric lines and is in phase with the line applied signal or shifted by 90 degrees therefrom, is applied with the amplitude value being varied with a period T, and so that a leakage current sent to synchronous detecting means is adjusted with respect to its phase or a reference signal is adjusted with respect to its phase to minimize (make zero) or maximize one of induced effective components or induced ineffective or reactive components of the leakage current having a frequency of 1/T.

DESCRIPTION OF THE PREFERRED EMBODIMENTS

Figure 2:
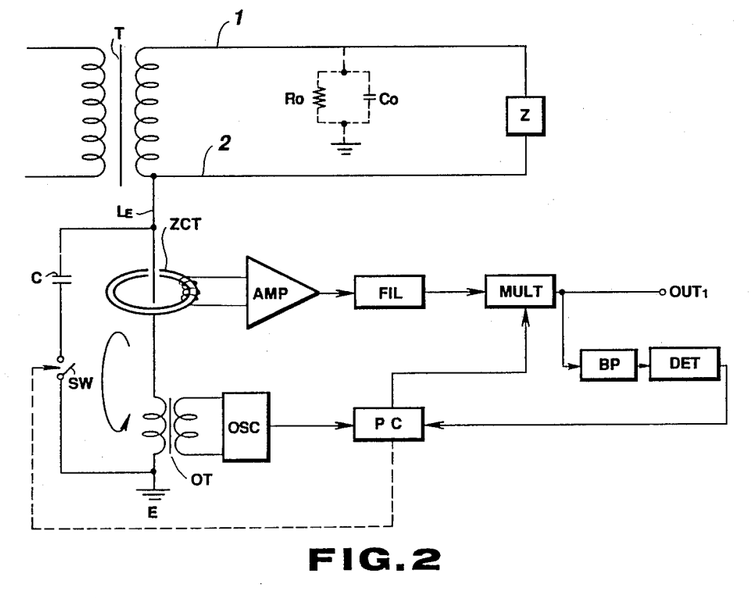
FIG. 2 is a block diagram showing a first embodiment of the present invention.

Referring to FIG. 2, there is shown a circuit diagram of a first embodiment of the insulation resistance measuring apparatus in accordance with the present invention. In the drawing, reference symbol T denotes a voltage transformer and reference numerals 1 and 2 denote lower voltage electric lines. Connected to one electric line 2 is a grounding conductor $L_E$ to satisfy the Japanese Second Kind Grounding Work Regulations, which conductor in turn is connected with a low-impedance transformer OT and a current transformer ZCT. The transformer OT is further coupled to a low frequency oscillator OSC. After a low frequency signal of a frequency $f_1$ is applied to the electric lines 1 and 2, a signal fed back to the grounding conductor $L_E$ is extracted through the current transformer ZCT, amplified at an amplifier AMP and then passed through a filter FIL where only the low frequency signal is extracted from the fed back signal. The extracted low frequency signal is then sent to a multiplier MULT as a synchronous detector to be synchronously detected with a signal sent from the low frequency oscillator OSC. The multiplier MULT and the other multipliers described hereafter are used as synchronous detectors for synchronous detection. As a result, the multiplier MULT produces at its output terminal OUT$_1$ such an output voltage that is inversely proportional to the insulation resistance existing between the electric lines and the earth, as mentioned earlier. In the present embodiment, however, for the purpose of correcting a phase shift due to the zero-phase current transformer ZCT, amplifier AMP and filter FIL, a series circuit of a capacitor C and a switch SW is provided in parallel to the grounding conductor $L_E$, the switch SW is opened and closed at a period of T, and a part of an output of the multiplier MULT is applied through a band-pass filter BP for extraction of a frequency 1/T and a rectifying circuit DET to a phase shifter (controller) PC wired between the oscillator OSC and the multiplier MULT.

Explanation will next be directed to the operation of the above arrangement and how to control the same.

When the switch SW is now turned ON (closed), a current $\omega_1 CV \cos \omega_1 t$ (shifted by a phase of 90 degrees) flowing through the capacitor C is added to the grounding conductor $L_E$ and thus a total leakage current $I_0$ flowing through the grounding conductor $L_E$ is as follows.

$$I_0 = (V/R_0) \sin \omega_1 t + \omega_1 C_0 V \cos \omega_1 t + \omega_1 CV \cos \omega_1 t \qquad (7)$$

Accordingly, an output $I_2$ of the filter FIL becomes as follows, from the equation (2).

$$I_2 = (V/R_0 \sin(\omega_1 t + \theta) + (C_0 + C)\omega_1 V \cos(\omega_1 t + \theta) \qquad (8)$$

The then output D of the multiplier MULT is as follows, from the equation (4)

$$D = (Va_0/2R_0) \cos(\theta - \theta_1) - \{(C_0 + C)\omega_1 Va_0\}/2 \cdot \{\sin(\theta - \theta_1)\} \qquad (9)$$

When the switch SW is turned ON and OFF at a period of T (in this embodiment, $T \gg 2\pi/\omega_1$), the value of the capacitor C included in the second term of the equation (9) varies also with the period T and thus the output D of the multiplier contains a component of a frequency 1/T. When the synchronous detector output OUT$_1$ is applied to the filter BP for extraction of only the frequency 1/T component, the filter produces such an output A as follows.

$$A = -kC\omega_1 Va_0 \sin(2\pi t/T + \phi) \sin(\theta - \theta_1) \qquad (10)$$

where k is a constant and $\phi$ is a phase determined by the filter characteristics and so on. Hence, when the output of the filter BP is rectified at, for example, the rectifying circuit DET, an output B of the rectifier DET is:

$$B = KC\omega_1 Va_0 |\sin(\theta - \theta_1)| \qquad (11)$$

When there is not present any phase shift in the measurement system (when $\theta = \theta_1$), the second term in the equation (9) becomes zero and thus it will be seen that the component of the frequency 1/T becomes zero.

Therefore, if the phase $\theta_1$ of the voltage $a_0$ sin $(\omega_1 t + \theta_1)$ of a constant amplitude applied to the second input terminal of the multiplier MULT is adjusted so that the output of the rectifying circuit DET becomes zero, i.e., $\theta - \theta_1$ becomes zero, the phase shift can be made to approach to zero.

The present invention is basd on such principle, that is, the switch SW is repetitively turned ON and OFF at intervals of the predetermined period T and the phase $\theta_1$ is automatically adjusted so that the component of the frequency 1/T becomes always zero, and the output $OUT_1$ of the multiplier MULT at this time is used to measure the insulation resistance always without any phase error, i.e., accurately. In this connection, the necessary automatic phase control circuit can be easily realized using existing techniques by those skilled in the art and thus explanation thereof is omitted.

A means for causing a current (which is sometimes referred to merely a phase-shifted ON/OFF current) shifted by a phase of 90 degrees and turned ON and OFF at intervals of T to flow through the grounding conductor $L_E$ is not limited to the above particular example and may be varied in various manners. For example, the means can be modified as shown in FIGS. 3(a), 3(b) and 3(c).

Figure 3A:
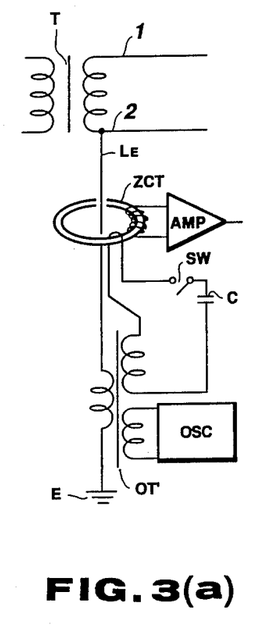
FIGS. 3(a), 3(b) and 3(c) show different modifications of a method of applying a signal to a leakage-current extracting means, respectively.
Figure 3B:
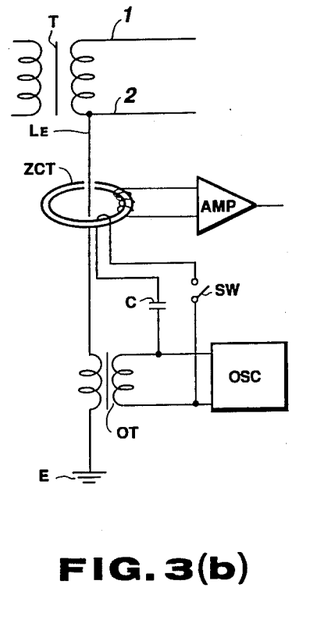
Figure 3C:
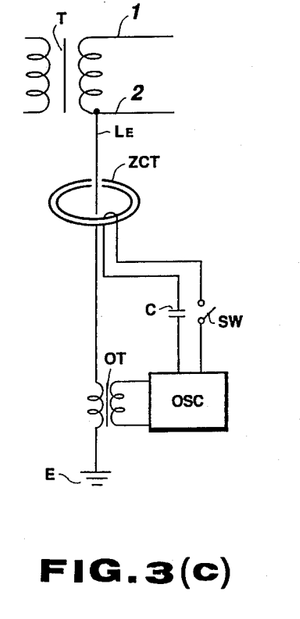

More specifically, a secondary winding is added to the application transformer OT to obtain such a phase-shifted ON/OFF current in FIG. 3(a), the phase-shifted ON/OFF current is obtained from the output terminals of the primary winding of the same transformer in FIG. 3(b), and the same ON/OFF current is obtained directly from the low frequency oscillator OSC in FIG. 3(c), respectively.

These means may be applied commonly to second and third embodiments of the present invention which will be detailed later.

For the purpose of the automatic adjustment of the phase shifter PC, if the output A of the filter BP is further synchronously detected by another synchronous detector (not shown) with a signal used to turn ON and OFF the capacitor C for example, then an output $S_0$ of the synchronous detector is expressed by the following equation.

$$S_0 = -k_0 C \omega_1 V a_0 \cos \phi \cdot \sin (\theta - \theta_1) \quad (12)$$

(where $k_0$ is a constant.)
Accordingly, in the case where $|\phi| < \pi/2$ and $|\theta - \theta_1| < \pi/2$, if $\theta > \theta_1$ then $S_0 < 0$, if $\theta < \theta_1$ then $S_0 > 0$, and if $\theta = \theta_1$ then $S_0 = 0$. Thus it will be appreciated that the discrimination of the phase adjustment direction (phase advance or retard direction) can be achieved with use of $S_0$ and the automatic phase control can be realized by utilizing the discrimination result.

Figure 4:
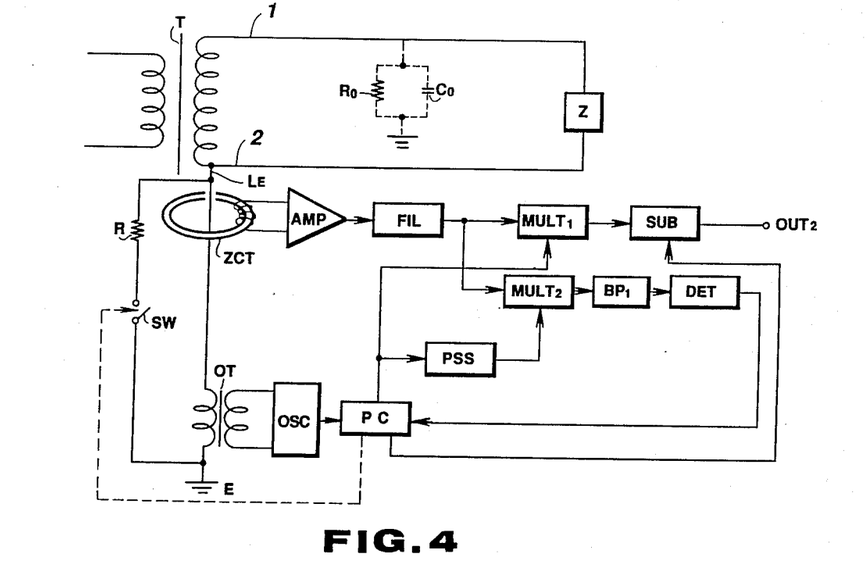
FIG. 4 is a block diagram showing a second embodiment of the present invention.

The present invention may be modified further as shown in FIG. 4. That is, FIG. 4 is a block diagram showing a second embodiment of the present invention. The second embodiment is featured in that a current in phase with the leakage current is added to the grounding conductor, reactive components are extracted from the leakage current and one of the reactive components having a frequency of 1/T is controlled to be minimized (zero); through, in the foregoing embodiment, effective components of the leakage have been synchronously detected, and the phase of the signal applied to the synchronous detecting means (synchronous detector) has been adjusted so that one of the effective components having a frequency of 1/T becomes minimized (zero).

More specifically, in FIG. 4, a resistor R is used in place of the capacitor C shown in FIG. 2; the output of the filter FIL, whose input is sent from the output of the zero-phase current transformer via an amplifier AMP, is partly applied, in addition to a first multiplier $MULT_1$, to a series circuit of a second multiplier $MULT_2$, a bandpass filter BP and a rectifying circuit DET; and an output of the rectifying circuit DET is used to control a phase control circuit PC.

Further, the first and second multipliers $MULT_1$ and $MULT_2$ receive at the other input terminals directly an output of the phase control circuit PC and the same PC output through a 90° phase shifter PSS, respectively. In addition, a subtractor SUB eliminates another output of the phase control circuit PC from the output of the first multiplier $MULT_1$.

Such an apparatus arranged as mentioned above will be detailed as to the operation of the apparatus and the functions of the respective component elements therein by using mathematical equations.

That is, when the switch SW inserted between the earthing point of the electric line 2 and the grounding point E is turned ON, a current $(V/R) \cdot \sin \omega_1 t$ is added to the aforementioned low frequency signal so that the total currents flow through the grounding conductor $L_E$. Thus, a leakage current $I_0$ of application low frequency components flowing through the grounding conductor $L_E$ is expressed as follows.

$$I_0 (1/R_0 + 1/R) V \sin \omega_1 t + \omega_1 C_0 V \cos \omega_1 t \quad (13)$$

Hence, the filter FIL produces, from the equation (2), an output $I_2$ which follows.

$$I_2 = (1/R_0 + 1/R) V \sin (\omega_1 t + \theta) + \omega_1 C_0 V \cos (\omega_1 t + \theta) \quad (14)$$

Assuming a voltage $a_0 \sin (\omega_1 t + \theta_1)$ is applied to the second input terminal of the first multiplier $MULT_1$, then the application of the same voltage to the 90° phase shifter PSS causes the shifter PSS to output a voltage $a_0 \cos (\omega_1 t + \theta_1)$. When the output voltage of the shifter PSS is applied to the second multiplier $MULT_2$, the multiplier $MULT_2$ produces an output $D_1$.

$$\begin{aligned} D_1 &= I_2 \times a_0 \cos(\omega_1 t + \theta) \\ &= (V a_0/2) \cdot (1/R_o + 1/R) \cdot \sin(\theta - \theta_1) + \\ &\quad \{(C_o \omega_1 V a_0)/2)\} \cdot \cos(\theta - \theta_1) \end{aligned} \quad (15)$$

(— has the same meaning as in the equation (3).)
When the switch SW is turned ON and OFF at intervals of a period T ($T \gg 2\pi/\omega_1$), the value of R in the first term of the equation (15) varies with the period T and thus the second amplifier $MULT_2$ produces the output $D_1$ containing a component of the frequency 1/T. When the output $D_1$ is applied to the filter BP which functions to extract only the component of the frequency 1/T, the filter BP produces such an output A as given below.

$$A = (kVa_0/R) \sin (2\pi t/T + \phi) \cdot \sin (\theta - \theta_1) \quad (16)$$

where k represents a constant and $\phi$ represents the phase determined by the phase characteristics of the filter BP and so on. Accordingly, when the output A of the filter BP is applied to the rectifying circuit DET to be rectified, the circuit DET produces such an output B as expressed by the following equation.

$$B = (kVa_0/R) \cdot |\sin(\theta - \theta_1)| \tag{17}$$

Hence, if the phase $\theta_1$ in the voltage $a_0 \sin(\omega_1 t + \theta_1)$ applied to the second input terminal of the multiplier MULT$_1$ is adjusted by the phase control circuit PC so that the output B of the rectifying circuit DET becomes zero, then $(\theta - \theta_1)$ becomes zero and therefore a phase shift can be made to approach to zero.

Since $(\theta - \theta_1)$ becomes zero under the correction or compensation of the phase shift in accordance with the above method, the output D of the first multiplier MULT$_1$, as seen from the equation (4), is expressed as follows during turning ON of the switch means SW.

$$D = (Va_0/2) \cdot (1/R_0 + 1/R)$$

During turning OFF of the switch SW, the output D becomes:

$$D = (Va_0/2) \cdot (1/R_0)$$

Thus, when the subtraction circuit SUB subtracts only $(Va_0/2) \cdot (1/R)$ (constant value) from the output D of the first multiplier MULT$_1$ during turning ON of the switch SW, the subtraction circuit SUB can produces an output OUT$_2$ of $(Va_0/2) \cdot (1/R_0)$ and thus the insulation resistance of the electric lines can be measured correctly.

For example, when the output A of the filter BP is further subjected to a synchronous detection by another multiplier (not shown) with a signal turning ON and OFF the switch means SW, this multiplier produces such an outptut $S_0$ as follows.

$$S_0 = (k_0 Va_0/R) \cos\phi \cdot \sin(\theta - \theta_1) \tag{18}$$

(where, $k_0$ is a constant.)

Accordingly, in the case where $|\phi| < (\pi/2)$ and $|\theta - \theta_1| < (\pi/2)$, if $\theta > \theta_1$ then $S_0 > 0$, if $\theta < \theta_1$ then $S_0 < 0$ and if $\theta = \theta_1$ then $S_0 = 0$. In this way, the discrimination of the phase adjustment direction (phase advance or retard direction) can be achieved on the basis of $S_0$ and thus automatic phase control can be effectively achieved on the basis of the discrimination result.

It goes without saying that even the present embodiment may be subjected to such modifications as shown in FIGS. 3(a), 3(b) and 3(c).

Although the mere resistor R has been turned ON and OFF at the period T in the foregoing embodiment, a variable resistor may be used to be varied in value continously (for example, sinusoidally) with the period T or a combination circuit of a coil and a capacitor may be used in carrying out the above phase control method.

Figure 5:
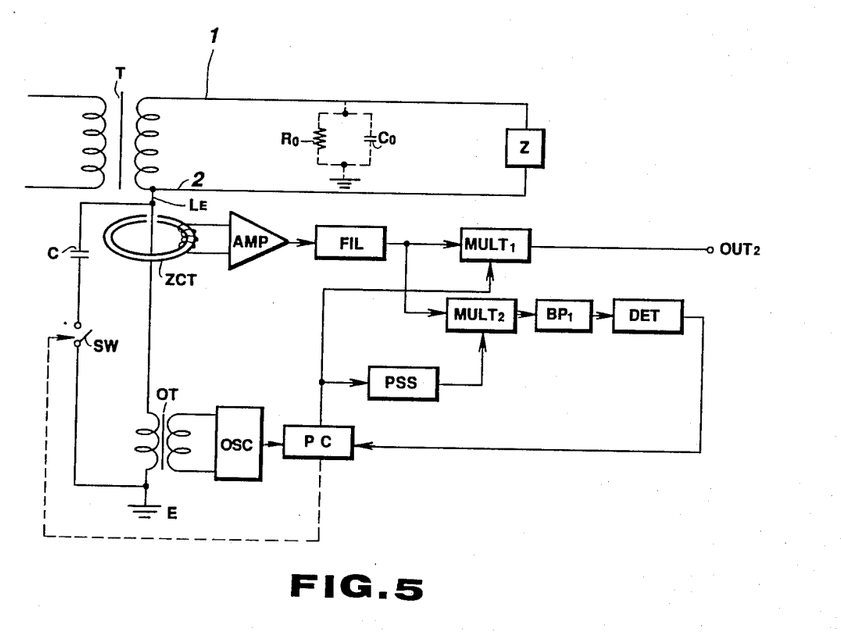
FIGS. 5 and 6 are block diagrams showing other embodiments of the present invention, respectively.

The present can also be modified as shown in FIG. 5. That is, FIG. 5 shows a third embodiment of the present invention, which corresponds to a combination of the first and second embodiments. More specifically, the circuit of FIG. 5 is different from that of FIG. 4 in that a capacitor C is provided as a reactance element inserted between the electric line 2 and the earth E in series with the switch SW as in FIG. 2, the subtractor SUB of FIG. 4 is removed, and phase control is made so that one of reactive components (synchronously detected with the use of a signal obtained by shifting the leakage signal by a phase of 90 degrees) of the second multiplier MULT$_2$ becomes maximum. Even in this circuit, when the switch SW is turned ON, the first synchronous detection output becomes as shown by the equation (9), whereas when the switch SW is turned ON and OFF at the period T (even in the present embodiment, $T \gg 2\pi/\omega_1$), the value of the capacitor C contained in the second term of the equation (9) varies similarly with the period T (that is, becomes C or zero) and the output D$_1$ of the first multiplier MULT$_1$ contains a component having a frequency of 1/T, as in FIG. 2.

In the present embodiment, a part of the leakage current is subjected at the second multiplier MULT$_2$ to a synchronous detection with the use of a signal $a_0 \cos(\omega_1 t + \theta_1)$ corresponding to the low frequency signal $a_0 \sin(\omega_1 t + \theta_1)$ subjected by the 90° phase shifter PSS to a 90° phase shift, so that the second multiplier MULT$_2$ can produce as its output a reactive component signal D' of the leakage signal.

The component of the frequency 1/T in the reactive component signal D' is obtained as the output A of the filter BP, which is expressed by the following equation.

$$A = kC\omega_1 Va_0 \sin(2\pi t/T + \theta) \cos(\theta - \theta_1) \tag{19}$$

where k is a constant and $\phi$ is the phase determined by the phase characteristics of the filter BP and so on. Therefore, the rectifying circuit DET, when receiving the output A of the filter BP, produces such an output B as given below.

$$B = kC\omega_1 Va_0 |\cos(\theta - \theta_1)| \tag{20}$$

Hence, when the phase $\theta_1$ in the voltage $a_0 \sin(\omega_1 t + \theta_1)$ applied to the second input terminal of the first multiplier MULT$_1$ so that the output B of the rectifying circuit becomes maximum, $(\theta - \theta_1)$ becomes zero and thus the phase shift can be made to approach to zero.

If the filter BP is subjected to a further synchronous detection by another multiplier (not shown) with the signal turning ON and OFF of the switch, the output $S_0$ of this synchronous detector is:

$$S_0 = k_0 C\omega_1 Va_0 \cos\phi \cdot \cos(\theta - \theta_1) \tag{21}$$

where $k_0$ is a constant.

Thus it will be appreciated also from the equation (12) that the output $S_0$ becomes maximum when $(\theta - \theta_1)$ is zero and thus the phase $\theta_1$ may also be controlled so that the output $S_0$ becomes maximum.

Figure 6:
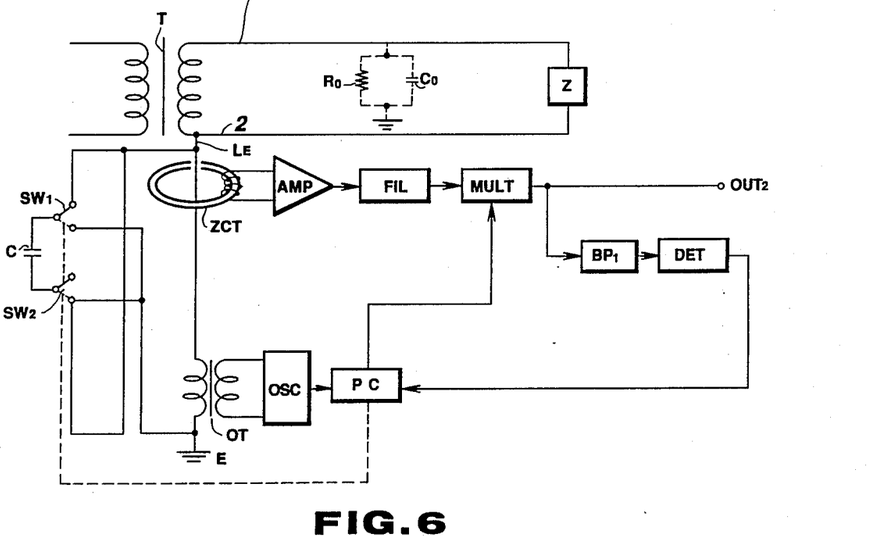

Further, the present invention can be modified as shown in FIG. 6. That is, FIG. 6 shows a fourth embodiment, in a block diagram form, of the present invention. The present embodiment is featured in that, as shown in FIG. 6, currents act on the leakage current inducing means as alternately phase-shifted by ±90 degrees with a period of T/2 by means of, for example, a capacitor C and two switches SW$_1$ and SW$_2$. The aim of the present embodiment is to increase the detection sensitivity by passing the alternately 90° phase-shifted currents through the leak current inducing means and thus making large the amplitude of the output of the band pass filter BP and also to relax the severe low-frequency (DC) pass characteristics demanded for the band pass filter BP when the period T is large (that is, when the frequency 1/T is as low as about 1 Hz).

FIG. 6 is different from the other foregoing embodiments in that a reactance circuit additionally inserted between the electric line 2 and the earth E comprises the capacitor C and the two switches SW$_1$ and SW$_2$ and these switches are turned ON and OFF at a period of T/2 so that the above alternate currents flow through the capacitor C in mutually opposite directions (the alternate currents are shifted by a phase of ±90 degrees with respect to the low frequency signal applied to the electric line).

With the circuit of FIG. 6, when switches SW$_1$ and SW$_2$ are wired as shown by solid lines, the low frequency signal flowing through the grounding conductor L$_E$ is expressed by the equation (7), since the current flowing through the capacitor C and the current flowing through the grounding conductor are the same in their flowing direction. Hence, the the output I$_2$ of the filter BP is given by the earlier-mentioned equation (8), while the output D of the multiplier MULT is by the equation (9).

On the other hand, when the switches SW$_1$ and SW$_2$ are switched as shown by dotted lines in FIG. 6 and the above capacitor current and the grounding line current are opposite in their flowing directions, the current $-\omega_1 CV \cos \omega_1 t$ is added to the grounding conductor L$_E$ in the opposite direction to the above, so that the then output I$_3$ of the filter FIL and the then output D of the multiplier MULT are given as follows, respectively.

$$I_3 = (V/R_0) \sin(\omega_1 t + \theta) + (C_0 - C)\omega_1 V \cos(\omega_1 t + \theta) \quad (22)$$

$$D_2 = (Va_0/2R_0) \cos(\theta - \theta_1) - \{(C_0 - C)\omega_1 Va_0\}/2 \times \sin(\theta - \theta_1) \quad (23)$$

Therefore, when the switches SW$_1$ and SW$_2$ operatively connected with each other are changed over at intervals of a time T/2 to satisfy the above-mentioned relationship, the synchronous detector produces such an output that contains a component having a frequency 1/T. (As seen from the equation (9), the second term becomes zero when $\theta = \theta_1$ and thus the frequency 1/T component will not be generated.) When the output D of the multiplier is applied to the filter BP acting to extract only the frequency 1/T component, the filter BP produces the output A expressed by the equation (10). When the output A of the filter BP is further applied to the rectifying circuit DET, the rectifier produces the rectified output B expressed by the equation (11). Thus, when the switches SW$_1$ and SW$_2$ are controlled so that the value B becomes zero as in the first embodiment, the phase shift can be made zero.

Figure 7A:
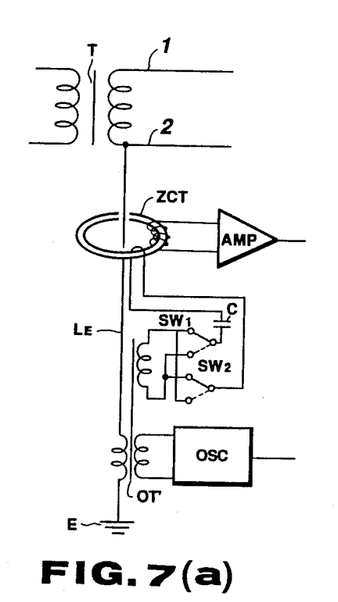
FIGS. 7(a) and 7(b) show block diagrams of modifications of FIG. 6, respectively.
Figure 7B:
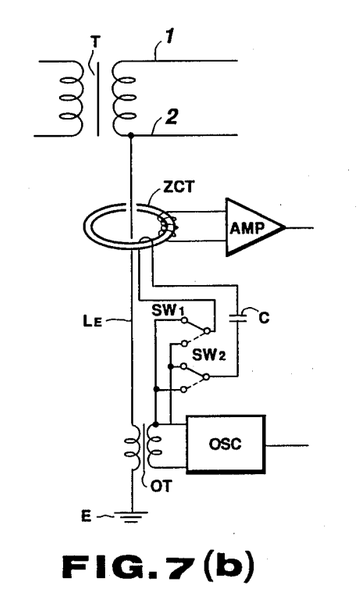

Even in the present embodiment, the method of obtaining the current flowing through the capacitor may be arranged so that the current is obtained from the secondary winding of the transformer OT as shown in FIGS. 7(a) and 7(b) or from the primary winding of the same transformer as that in FIG. 6, like the first embodiment of the present invention.

For example, when the output A of the filter BP is subjected at another multiplier (not shown) to a further synchronous detection with the use of a signal acting to turning ON and OFF the capacitor C, this multiplier produces such an output S$_0$ as given below.

$$S_0 = -k_0 C\omega_1 Va_0 \cos \phi \cdot \sin(\theta - \theta_1) \quad (24)$$

(where k$_0$ is a constant.)

Accordingly, in the case where $|\phi| < (\pi/2)$ and $|\theta - \theta_1| < (\pi/2)$, if $\theta > \theta_1$ then S$_0 > 0$, if $\theta < \theta_1$ then S$_0 < 0$ and if $\theta = \theta_1$ then S$_0 = 0$. In this way, the discrimination of the phase adjustment direction (phase advance or phase retard direction) can be achieved on the basis of S$_0$ and thus automatic phase control can be effectively achieved on the basis of the discrimination result.

The amount of phase adjustment may also be varied depending on the magnitude of the output S$_0$. That is, if the output S$_0$ is large then the phase is varied by a large step, while if the S$_0$ is small then the phase is varied by a small step, whereby the phase adjustment can be quickly and accurately effected.

There may also be employed such an arrangement that the phase adjustment is intermittently carried out as by effecting the phase adjustment for a certain constant, fixing $\theta_1$ when $\theta - \theta_1 \approx 0$ and again effecting the phase adjustment after the passage of a certain constant time. Such a modification may be similarly applied to the foregoing other embodiments.

Although the current flowing through the fixed capacitor or the fixed resistor has been turned ON and OFF at a period of T by means of the switch(es) in all the foregoing embodiments to act on the leakage current extracting means, a variable capacitor and a variable resistor may be used in place of the switch(es) and the fixed capacitor and resitor and be controlled in their values depending on the period T, providing substantially the same function as that in the foregoing embodiments.

Further, the variable capacitor and the variable resistor may comprise each such an active element as a transistor, a pin diode, a vari-cap diode or the like.

The leakage current extracting means may comprise not only the current transformer coupled to the grounding conductor but also the current transformer coupled to the electric line 1 or 2.

Furthermore, the capacitor C or the resistor R has been connected to the side of the grounding electric line, but it may be inserted between the non-grounding electric line and the earth. In this connection, since the capacitor C or the resistor R is applied with the voltage of a commercial power source, a current flowing through the capacitor or resistor becomes remarkably large and thus such elements must be capable of withstanding such a large current.

The voltage V has been applied to the resistor or capacitor as shown in the equation (7), but it is clear that the voltage is not limited to the specific example and another voltage may be used without any trouble in the operation.

When the phase, which is outputted from the phase control circuit and applied to the second input terminal of the phase synchronous circuit, is previously adjusted for in-phase control and only the phase shift due to the temperature and so on is compensated for through the aforementioned automatic phase control, the phase synchronization time can be shortened.

Although the capacitor element has been used to provide the current having a phase difference of 90 degrees with respect to the measuring low-frequency voltage in the foregoing embodiments, it will be obvious that the present invention is not limited to the particular example and may employ another circuit network (for example, a combination circuit of an inductance and a capacitor).

The phase of the reference input signal applied to the second input terminals of the multipliers MULT$_1$ and MULT$_2$ has been adjusted for the purpose of the phase adjustment in the foregoing embodiments, but it is clear that the phase of the comparison input signal or signals applied to each or both of the both multipliers may be adjusted with substantially the same effect as in the embodiments.

Though the explanation has been made as to the single-phase, 2-wire electric line in the foregoing embodiments, the invention may be applied to a single-phase, 3-wire electric line or to a three-phase, 3-wire line.

The low frequency signal voltage has been of a sine wave in the foregoing explanation, but the present invention is not restricted to the particular example and the fundamental wave component or harmonic component of, for example, a rectangular wave may be used as the low frequency signal voltage.

Although the phase of the signal applied to the second input terminal of the multiplier has been adjusted for phase adjustment in the foregoing explanation, the phase of the output signal of the filter FIL applied to the first input terminal of the multiplier may be obviously adjusted to obtain the same effect.

The resistor R has been connected and disconnected at intervals of the period T in the foregoing explanation, but the present invention is not intended to limit to the particular example and it may be randomly connected and disconnected with a predetermined interval T to obtain the same effect.

The foregoing measuring method is not restricted to the electric line for electric power transmission and may be applied widely to such an electric line at its one end connected to the earth as an electric line for a lightning protector apparatus, a communication line and so on.

Figure 8A:
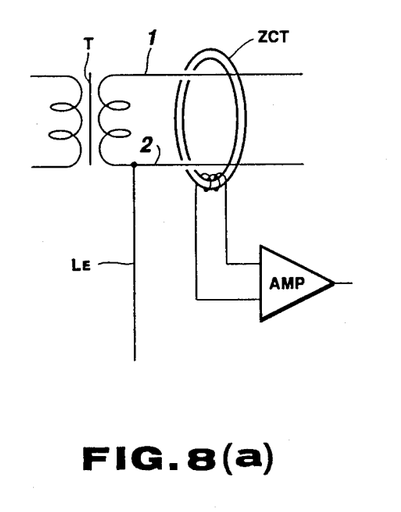
FIGS. 8(a) and 8(b) show different modifications of means for applying a signal to electric lines or for extracting a leakage current in the present invention, respectively.
Figure 8B:
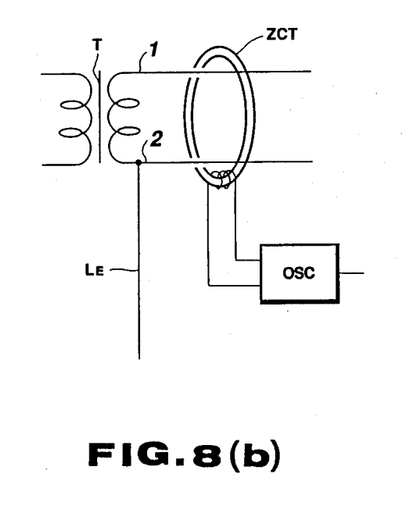

For the purpose of applying to the electric line the low frequency signal and the same signal subjected to a variation with the period T or of extracting the leakage component of these signals, the electric lines 1 and 2 may be passed through the current transformer ZCT as coupled thereto as shown in FIGS. 8(a) and 8(b), in addition to coupling the transformer to the grounding conductor as in the foregoing embodiments.

As has been disclosed in the foregoing, in accordance with the present invention, the leakage current as the measurement signal. after subjected to a variation with the period T, acts on the means for extracting the measurement signal or leakage current, and the phase of the extracted leakage current or the phase of the sigalused to synchronously detect the leakage current is adjusted so that the component of the leakage current having a frequency of 1/T becomes minimum or maximum, thereby correcting a measurement error resulting from variations in the characteristics of the measurement circuit. As a result, automatic correction can be facilitated and the insulation resistance can be obtained always accurately.

What is claimed is:

1. A method of measuring an insulation resistance between an electric line and the earth on the basis of a signal obtained by applying a low frequency signal having a frequency $f_1$ different from a commercial frequency to the electric line through a first transformer coupled to a grounding conductor of a voltage transformer of the electric line or to the electric line, by extracting a leakage current component of said low frequency signal fed back to said grounding conductor through a second transformer coupled to the grounding conductor or to the electric line and then by applying said extracted leakage current component to a first input of synchronous detecting means; said method comprising the steps of:

branching said low frequency signal;
  changing the amplitude of said branched signal so that it varies with a period T or with a random period including said period T;
  causing said changed branched signal to act on means for extracting said leakage current component; and
  controlling a phase of a signal applied to a second input of said synchronous detecting means relative to the phase of the leakage current component so that a component of a frequency 1/T contained in a synchronous detection output of said synchronous detecting means becomes maximum or minimum.

2. An insulation resistance measuring method as set forth in claim 1, wherein said leakage current component extracting means comprises a current transformer which is coupled to the grounding conductor or the electric line, said branched low frequency signal is passed through a circuit which includes a variable or fixed reactance and switching means, a signal line through which said branched signal flows is coupled to said current transformer, and a value of said variable reactance or said switching means is controlled with said period T or with said random period including the period T.

3. An insulation resistance measuring method as set forth in claim 2, whrein said rectance comprises a capacitor, and a phase of said leakage current component or a phase of the signal applied to the second input of said synchronous detecting means is adjusted so that the component of said frequency 1/T contained in said synchronous detection output becomes zero.

4. An insulation resistance measuring method as set forth in claim 2, wherein said reactance comprises a fixed or variable resistor, and a phase of said leakage current component or a phase of a signal applied to the second input of said synchronous detecting means is controlled so that the component of said frequency 1/T contained in a signal obtained by synchronously detecting said leakage current component with a signal shifted by a phase of 90 degrees from said low frequency signal phase approaches zero.

5. An insulation resistance measuring method as set forth in either of claims 1 or 2, wherein a phase of said branched low frequency signal varied with said period T or with said random period including the period T is shifted by 90 degrees, and phases of signals applied to said synchronous detecting means is controlled so that the component of said frequency of 1/T contained in a reactive component of said leakage current becomes maximum.

6. A method of measuring an insulation resistance between an electric line and the earth on the basis of a signal obtained by applying a low frequency signal having a frequency $f_1$ different from a commercial frequency to the electric line through a first transformer coupled to a grounding conductor of a voltage transformer of the electric line or to the electric line, by extracting a leakage current component of said low frequency signal fed back to said grounding conductor through a second transformer coupled to the grounding conductor or to the electric line and then by applying said extracted leakage current component to a first input of synchronous detecting means; said method comprising the steps of:

alternately switching said low frequency signal at a period T/2 into signals shifted by a phase of +90 degrees and by a phase of −90 degrees;

causing said phase-shifted signals to act on leakage current component extracting means; and controlling a phase of a signal applied to a second input of said synchronous detecting means so that a component of a frequency 1/T contained in an output of said synchronous detecting means approaches a maximum or minimum.

* * * * *